United States Patent [19]

Kasai et al.

[11] 4,395,849

[45] Aug. 2, 1983

[54] AUTOMATIC FREQUENCY ADJUSTING METHOD FOR MECHANICAL RESONATORS

[75] Inventors: Yoshihiko Kasai, Yokohama; Tsunenori Hayashi, Kawasaki, both of Japan

[73] Assignee: Fujitsu Limited, Kawasaki, Japan

[21] Appl. No.: 199,649

[22] Filed: Oct. 22, 1980

[30] Foreign Application Priority Data

Oct. 23, 1979 [JP] Japan ................................ 54-136898

[51] Int. Cl.³ ....................... B24B 1/00; H04R 17/00; B23K 9/00
[52] U.S. Cl. ...................................... 51/319; 51/413; 51/165 R; 29/25.35; 219/121 LM
[58] Field of Search ............. 51/319, 320, 321, 165 R, 51/410, 413; 29/25.35, 593; 324/80, 81; 219/121 L, 121 LM

[56] References Cited

U.S. PATENT DOCUMENTS

| | | | |
|---|---|---|---|
| 3,808,752 | 5/1974 | Beaver et al. | 51/319 |
| 3,833,999 | 9/1974 | Budych et al. | 29/25.35 |
| 4,063,910 | 12/1977 | Huguenin et al. | 51/413 |
| 4,131,484 | 12/1978 | Caruso et al. | 29/25.35 |
| 4,190,937 | 3/1980 | Massa | 29/593 |
| 4,281,484 | 8/1981 | Massa | 51/165 R |
| 4,346,537 | 8/1982 | Masujima et al. | 51/413 |

FOREIGN PATENT DOCUMENTS

| | | | |
|---|---|---|---|
| 1929994 | 2/1972 | Fed. Rep. of Germany . | |
| 2460258 | 6/1976 | Fed. Rep. of Germany | 51/413 |
| 50-45593 | 4/1975 | Japan . | |
| 51-92191 | 6/1976 | Japan . | |

*Primary Examiner*—Harold D. Whitehead
*Assistant Examiner*—Robert A. Rose
*Attorney, Agent, or Firm*—Staas & Halsey

[57] ABSTRACT

A method for automatic frequency adjustment of mechanical resonators, in which plural target frequencies are specified spaced across the distribution curve of the initial resonance frequencies of the mechanical resonators; an output quota for finished resonators is specified at each target frequency; the initial resonance frequency of each resonator is measured, and the resonator is then transferred to an automatic trimming machine; and the adjusting frequency of the automatic trimming machine is reset, for that particular resonator, to the particular one of the target frequencies which is next higher than the initial resonance frequency of the mechanical resonator. However, if the output quota for that target frequency has already been filled, a still higher target frequency is specified instead. If the output quotas have been filled for all target frequencies within a permissible adjustment range, then the resonator is returned for coarse adjustment. Additionally, the resonance frequency of the resonator may be monitored during the adjustment process in the trimming machine, and, if the resonance frequency of the resonator rises above the target frequency by more than a permissible margin of error during the trimming process, the resonator is recycled to be readjusted by the same process to a higher target frequency.

2 Claims, 5 Drawing Figures

AUTOMATIC FREQUENCY ADJUSTING METHOD FOR MECHANICAL RESONATORS

BACKGROUND OF THE INVENTION

Mechanical filters are widely used in carrier transmission systems. When used in a channel translation stage, particularly in an FDM (frequency division multiplexing) system, the total number of mechanical filters used is very large, because such mechanical filters are used for every channel, and recent large capacity transmission systems may use up to 900 channels. Moreover, each mechanical filter includes several mechanical resonators which are its main component element, and the several mechanical resonators used in a filter are designed to have resonance frequencies which are incrementally different from each other.

The characteristics of a mechanical filter are notably dependent on whether the resonance frequency of each mechanical resonator matches its design frequency or not.

Therefore, it is necessary to adjust the resonance frequency of each mechanical resonator to its design frequency. Such adjustment is performed in two steps, namely coarse adjustment and fine adjustment.

SUMMARY OF THE INVENTION

This invention relates to a method of automatic fine adjustment of the resonance frequencies of mechanical resonators, particularly those resonators which are to be used for mechanical filters, by means of a laser trimming or sand blast trimming machine.

A mechanical resonator which has completed the coarse adjustment is subjected to fine adjustment by means of the sand blast or laser trimming machine. Laid-open Japanese Patent Application No. 51-92191 which is hereby incorporated by reference, has disclosed an automatic fine adjustment system utilizing the laser or sand blast trimming machine. A method of automatic resonance frequency adjustment of mechanical resonators, conforming to this disclosure, is outlined with reference to FIG. 1.

In FIG. 1, the horizontal axis represents the distribution of resonators, and the vertical axis shows their resonance frequencies, where mechanical resonators having completed coarse adjustment have respective natural resonance frequencies distributed along the distribution curve A in FIG. 1. The design values for resonance frequencies of the respective resonators for forming filters are shown as $f_1, f_2, \ldots, f_n$.

Therefore, it is an object of the fine adjustment to trim the coarse-adjusted resonators so that the desired number of resonators having resonance frequencies $f_1, f_2, \ldots, f_n$ can be obtained.

The natural resonance frequencies of the resonators which have completed the coarse adjustment are measured, and then respective resonators are transferred to the respective catchers in the areas corresponding to the frequency regions I, II, . . . , N. Thus, all resonators which have completed the coarse adjustment are sorted among the areas I, II, . . . , N according to their natural resonance frequencies.

The adjusting target frequencies $f_1, f_2, \ldots, f_n$ are respectively assigned to the areas (and frequency regions) I, II, . . . , N.

Each resonator sorted is trimmed by the laser or sand blast trimming machine to the adjusting target frequency. For example, the resonator which is caught in the area N-1 is trimmed to the adjusting target frequency $f_{n-1}$.

Readjustment by the trimming machine is carried out so that the mass of resonator is reduced, e.g. by laser irradiation or sand blast applied to the resonator's edge, in order to raise the natural resonance frequency. Practical examples of frequency adjustments of resonators by such a laser trimming or sand blast trimming machine are respectively indicated in the disclosure of the laid-open Japanese Patent Application No. 50-45593 and German Pat. No. 1,929,994, which are hereby incorporated by reference.

In the method indicated in the above-mentioned laid-open Japanese Patent Application No. 51-92191, the coarse-adjusted resonators are first sorted in accordance with several precise adjustment target frequencies before the fine adjustment, and then trimmed to the target frequencies for each group. This method has the disadvantage that full automatic adjustment is difficult because of adjustment for each group, and since the adjustment by the trimming machine is possible only for one range of frequency in a single batch of resonators, economical use of the machine and efficient manufacture of the mechanical filters are difficult. Moreover, this method does not permit an automatic adjustment for the required number of resonators in each specific resonance frequency.

Therefore, it is an object of this invention to offer a method of automatic frequency adjustment for mechanical resonators, which avoids the above disadvantages and facilitates full automatic frequency adjustment to produce the required number of resonators in a short period of time with high efficiency. The method of automatic frequency adjusting of mechanical resonators according to the present invention comprises the steps of:

measuring the resonance frequencies of mechanical resonators sent from a container which contains plural mechanical resonators;

comparing the measured resonance frequencies with predetermined plural adjusting target frequencies;

selecting one adjusting target frequency which is higher than the measured resonance frequency and minimizes the difference between the measured resonance frequency and the selected adjusting target frequency; and setting the adjusting frequency of a laser or sand blast trimming machine to the selected adjusting target frequency of adjustment.

According to another embodiment of this invention, an automatic frequency adjusting method for mechanical resonators further comprises the steps of:

measuring the resonance frequencies of mechanical resonators being trimmed by the laser or sand blast trimming machine;

comparing the measured frequencies with the adjusting target frequency which has been set at the trimming machine; and when the measured frequencies are higher than the adjusting target frequency by the specified allowable frequency error, feeding back the resonators so that they can be retrimmed to a further higher adjusting target frequency.

According to a further embodiment, the number of mechanical resonators manufactured and adjusted by the laser or sand blast trimming machine is counted for each individual adjusting target frequency, and when the counted number of mechanical resonators manufactured and adjusted corresponding to a particular adjusting target frequency coincides with a predetermined number, the selected adjusting target frequency is reselected to a further higher adjusting target frequency.

DESCRIPTION OF THE PREFERRED EMBODIMENTS

Figure 1:
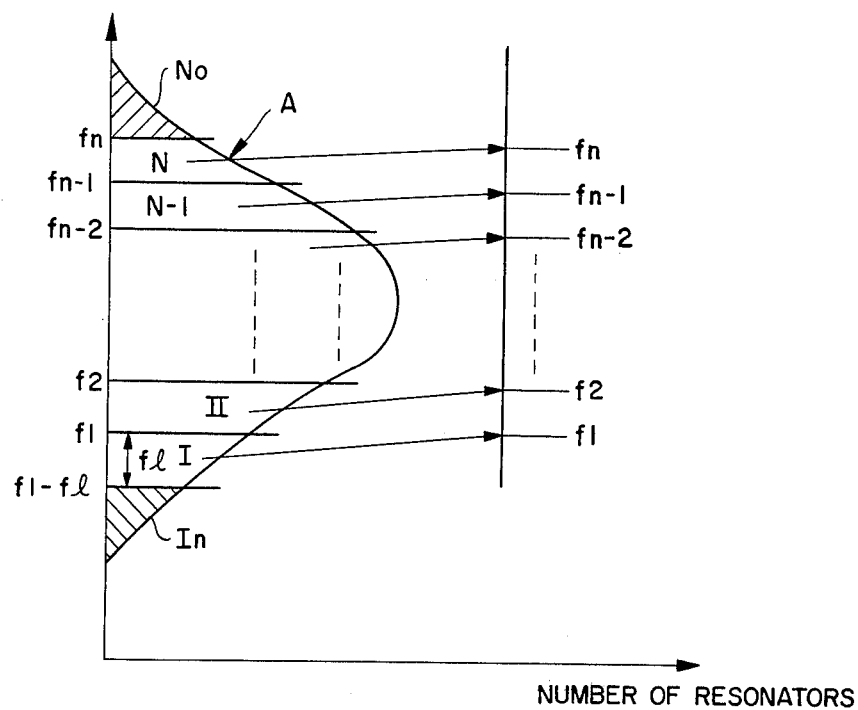
FIG. 1 is a graph showing the distribution of resonance frequencies of resonators after coarse adjustment.

An embodiment of this invention will now be explained with reference to FIG. 2 and FIG. 3.

The numeral 1 denotes the container of plural mechanical resonators which have completed the coarse adjustment, and this container operates to sequentially send its mechanical resonators to the carrier 2. The carrier 2 can be realized in various ways. For example, it can be formed as a groove, so that the resonators are supplied by running along the groove. The resonators may be put on a turntable or belt conveyor, so that they are supplied through the movement of such turntable or conveyor. In case the resonance frequency of mechanical resonators is to be measured by a magnetic field, a magnetizer 3 is provided on the way to a measuring part 4, and the resonator is magnetized when it passes thereby. Each resonator is then sent to the measuring part 4, where its natural resonance frequency is measured. Such a measuring method is already well known and, for example, the measuring principle explained in the paper "The measuring method of torsional mode resonator for mechanical filter", pages 105 to 109 of the Tokin Technical Review, Vol. 7, No. 1, (May, 1974), which is hereby incorporated by reference, may be employed.

Since frequency adjustment is done by reducing the mass of a resonator to raise its resonance frequency, if the resonance frequency $f_r$ of the coarse-adjusted resonator is already higher than the maximum adjusting target frequency $f_n$, fine adjustment by laser or sand blast is no longer possible. In addition, the range of adjustment by means of a laser or sand blast trimming machine must be limited, to prevent excessive trimming time due to the limited output energy of laser or sand blast. Writing the adjustment range limit as $f_l$, fine adjustment by laser or sand blast is impossible when $f_r < f_1 - f_l$. In this case, it is necessary to repeat the coarse adjustment in order to reduce the frequency deviation to be adjusted.

The resonance frequency $f_r$ measured at the measuring part 4 is sent to the controller 5 via the line L1. The controller 5 provides the functions of blocks 5-1 and 5-2 of the flow chart of FIG. 3 (both enclosed by the broken line), as will be explained later, and it can be structured minimally as a comparator and register. However, for extension or flexibility of functions, it is better to realize the controller 5 as an LSI microprocessor. The controller 5 compares the preset adjusting target frequencies $f_1, f_2, \ldots, f_n$ ($f_1 < f_2 < \ldots f_n$) with the resonance frequency $f_r$ measured by the measuring part 4. When the resonance frequency $f_r$ is higher than the maximum adjusting target frequency $f_n$, or lower than the frequency $f_1 - f_l$ (i.e. lower than the minimum adjusting target frequency $f_1$ by the maximum frequency deviation $f_l$ to be adjusted), namely when $f_r > f_n$ or $f_r < f_1 - f_l$, a control signal is sent out to the line L2.

Existence of a limit in adjustment range due to economization of trimming time is explained in detail in the above-mentioned laid-open Japanese Patent Application No. 50-45593 related to the laser trimming machine. Accordingly, existence of the control signal on the line L2 in FIG. 2 indicates that fine adjustment by the laser or sand blast is inadequate for the coarse-adjusted resonators being measured. Number 6 denotes the gate or line change-over switch, which changes the lines so that the resonators which have passed the measuring part 4 are ejected to the catcher 7, because they are judged unsuitable for fine adjustment, if a control signal appears on the line L2.

On the other hand, when the measured resonance frequency $f_r$ is found not to correspond to the conditions $f_r > f_n$ or $f_r < f_1 - f_l$ when compared at the controller 5, an adjusting target frequency $f_i$, which is higher than the measured resonance frequency $f_r$ and minimizes the difference $f_i - f_r$, is selected from the plural adjusting target frequencies $f_1, f_2, \ldots, f_n$.

In this case, where the control signal does not appear on the line L2, the resonators sent from the measuring part 4 pass the gate 6 and are then sent to the laser or sand blast trimming machine 8. Simultaneously, the $f_i$ setting signal is issued from the controller 5 to the control circuit 82 of the trimming machine, and to output destination controller 11, via the line L3. As the trimming machine 8, the laser trimming machine disclosed in the aforementioned laid-open Japanese Patent Application No. 50-45593 can be used directly. The control circuit 82 of the trimming machine 8 comprises an oscillator and an exciting signal generator. The oscillator generates the adjusting target frequency $f_i$ from the $f_i$ setting signal sent via the line L3 and sends it to the comparator 83. Simultaneously, the exciting signal generator sends the exciting signal to the trimming part 81 via the line L4. The trimming part 81 actually performs through a structure consisting of a mechanism for generating and directing the laser, a mechanism for controlling the laser irradiation location, and a circuit for activating the adjusted resonators during trimming with the exciting signal being sent from the line L4 and measuring the resonance frequencies as they change during trimming. The measured resonance frequency value $f_r$ is sent to the comparator 83 via the line L5 from the trimming part 81 during trimming. The comparator 83 compares the $f_i$ adjusting target frequency sent from the controller 82 with the resonance frequency $f_r$ sent from the trimming part 81, and feeds back the difference frequency $f_i - f_r$ to the trimming part 81 via the line L6. Therefore, the trimming part 81 performs the trimming in a degree corresponding to the difference frequency $f_i - f_r$.

As will be understood from the above explanation, the control system of the trimming machine 8 forms a feedback loop, and the amount of offset in the measurement cannot be neglected. Therefore, the final adjusting value of the trimming machine 8 becomes $f_i + e$ (e is the allowable error). Trimming of the trimming part 81 is carried out so that the frequency difference $f_i - f_r$ sent from the line L6 becomes zero, and when $f_i-f_r$ enters the range of allowable error e, trimming ends, and the trimmed resonator is sent to the output destination controller 11 via the gate 9.

The gate 9 operates similarly to the gate 6, and performs two kinds of operations according to the two control signals A and B which may exist on the line L7 as outputs from the comparator 83. The control signal A appears when trimming is complete, and at this time, as mentioned above, the gate 9 operates so that the trimmed resonators are sent to the output destination controller 11.

On the other hand, the control signal B is generated when $f_r>f_i+e$ in the comparator 83. The condition $f_r>f_i+e$ means that the resonance frequency $f_r$ has exceeded the adjusting target frequency $f_i$ by the allowable error e or more due to an excessive adjustment.

Such a state is believed most likely to result from the fact that the resonator temperature itself becomes high during trimming, so that the resonance frequency during trimming is different from that at a normal temperature. When the control signal B appears on the line L7 in such a condition, the resonator can no longer be adjusted to the adjusting target frequency $f_r$. For this reason the gate 9 operates so that the resonator is fed back to the container 1 via the carrier 10. After the resonator is returned to the container 1, adjustment will be carried out so that the resonator is automatically adjusted to a resonance frequency at the next adjusting target frequency higher than $f_i$, when it is sent again next to the carrier 2.

When resonators being sent to the output destination controller 11 have a resonance frequency $f_i$, the $f_i$ setting signal is being sent to the output destination controller 11 from the controller 5 via the line L3. Thus, the output destination controller 11 is similar to the gates 6 and 9 in its basic mechanism, and responds to the $f_i$ setting signal. Namely, the line switching is carried out so that the resonators having the resonance frequency $f_i$ are guided to the particular catcher $12i$ among the catchers 121, 122 ... 12n.

As explained above, the mechanical resonators which have completed the coarse adjustment and are contained in the container 1 are automatically adjusted by the present invention to an adjusting target frequency among the $f_i, f_2, \ldots f_n$ in accordance with their natural resonance frequency.

An embodiment of this invention will now be explained where the desired number of resonators can be obtained automatically for every adjusting target frequency $f_i, f_2, \ldots f_n$, and control of the output distribution can also be done automatically.

Figure 2:
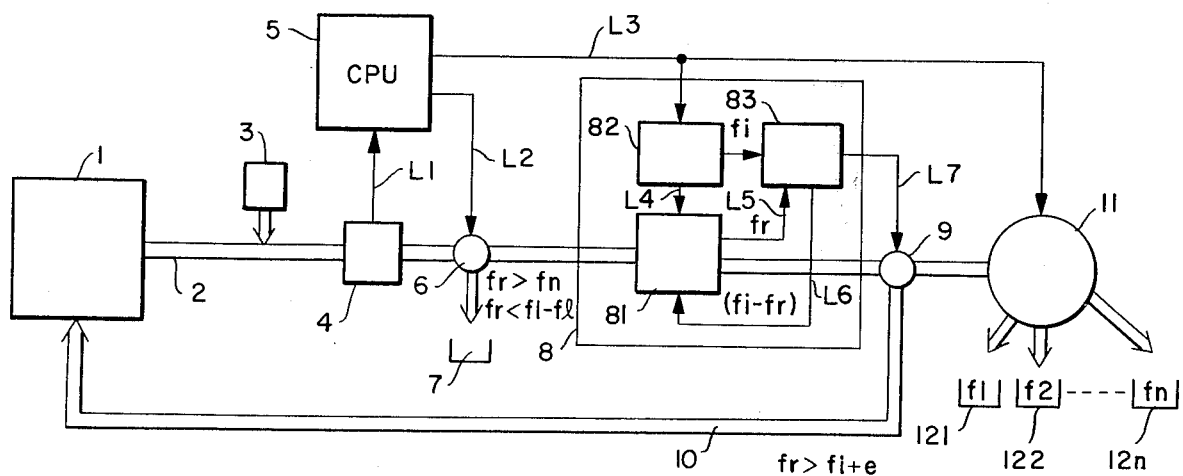
FIG. 2 is a block diagram of an embodiment of this invention.
Figure 3:
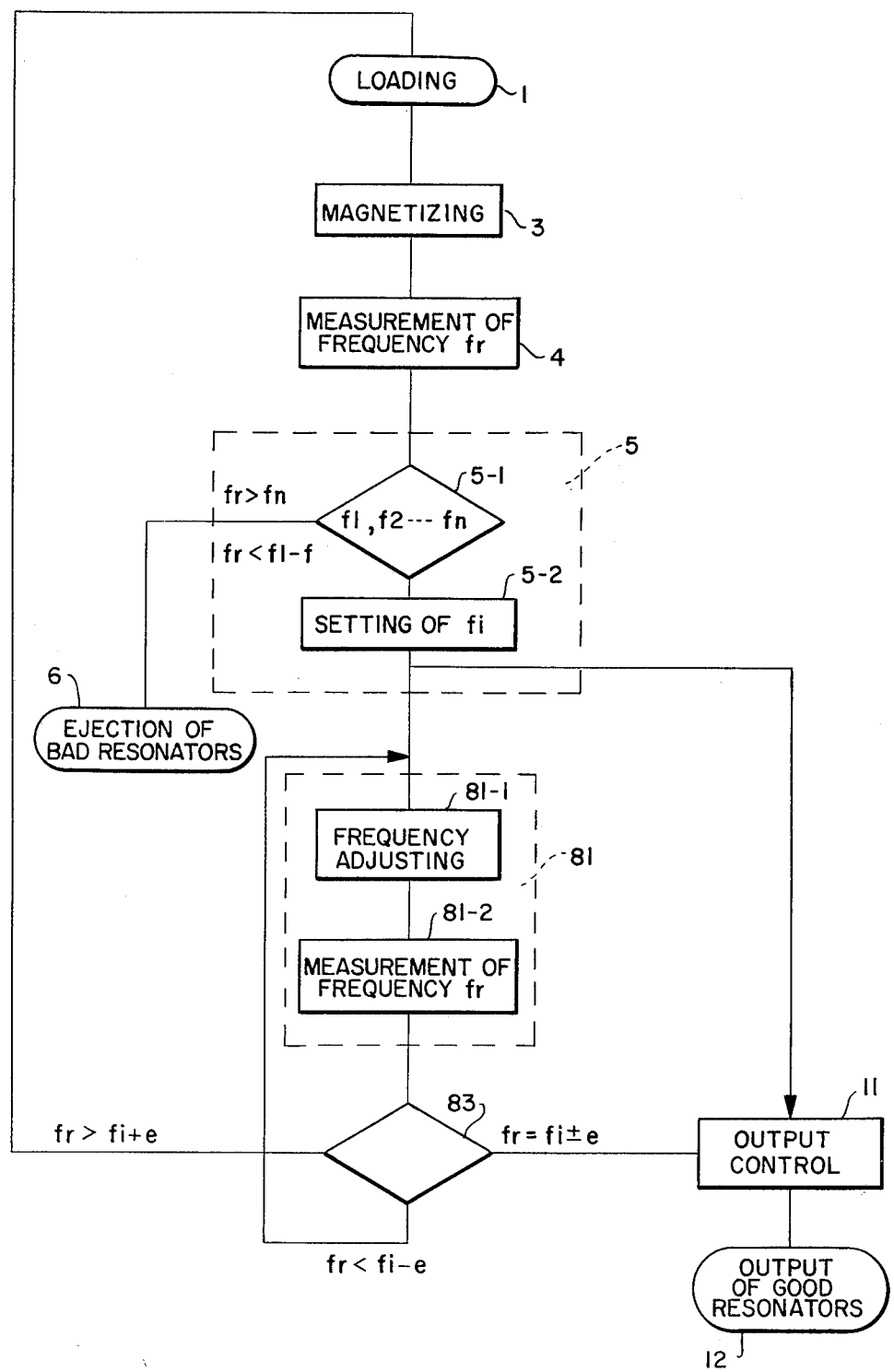
FIG. 3 is an operation flow chart of an embodiment of this invention.
Figure 4:
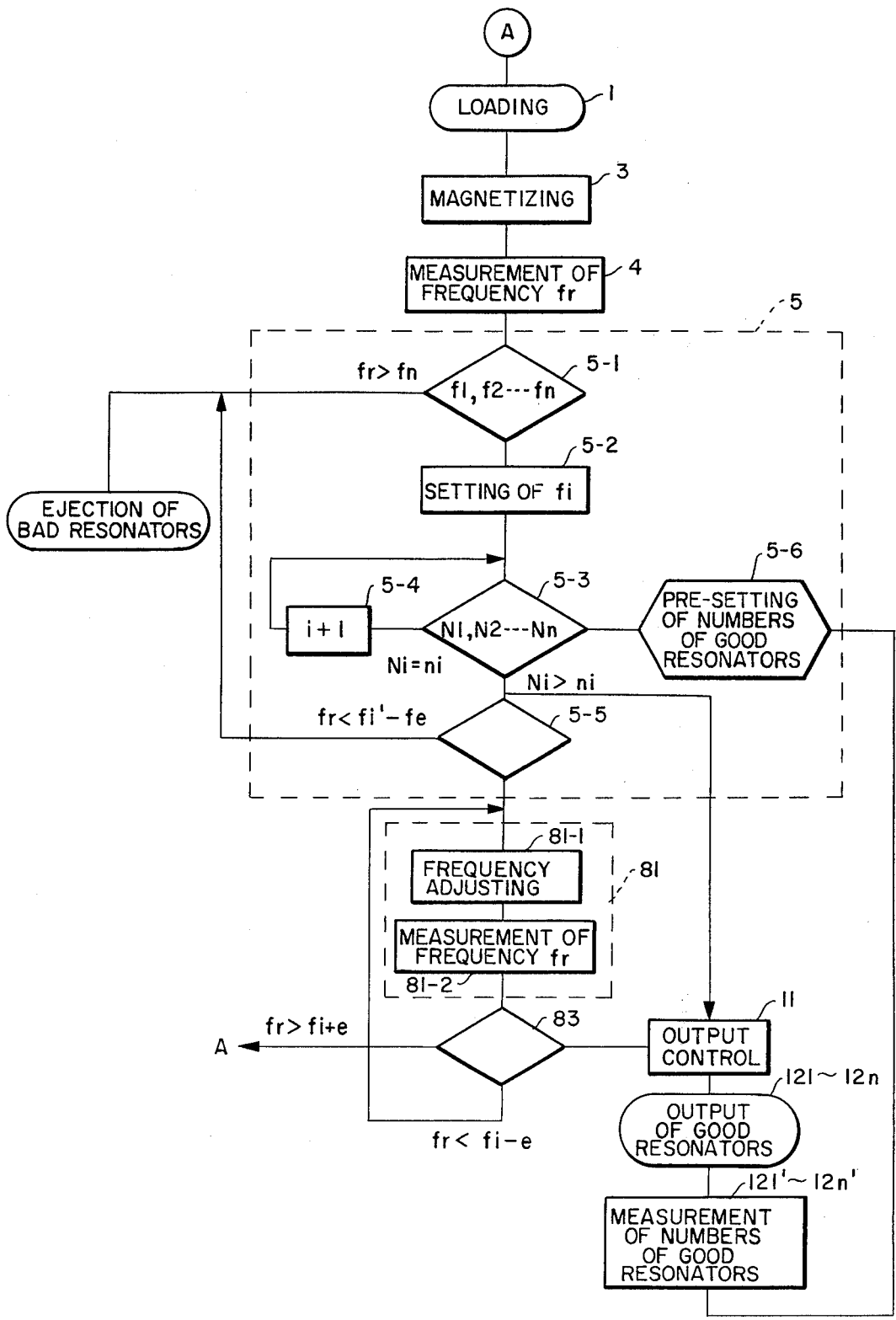
FIG. 4 is a flow chart of another embodiment of the invention, in which the number of finished resonators produced at each resonance frequency is counted.
Figure 5:
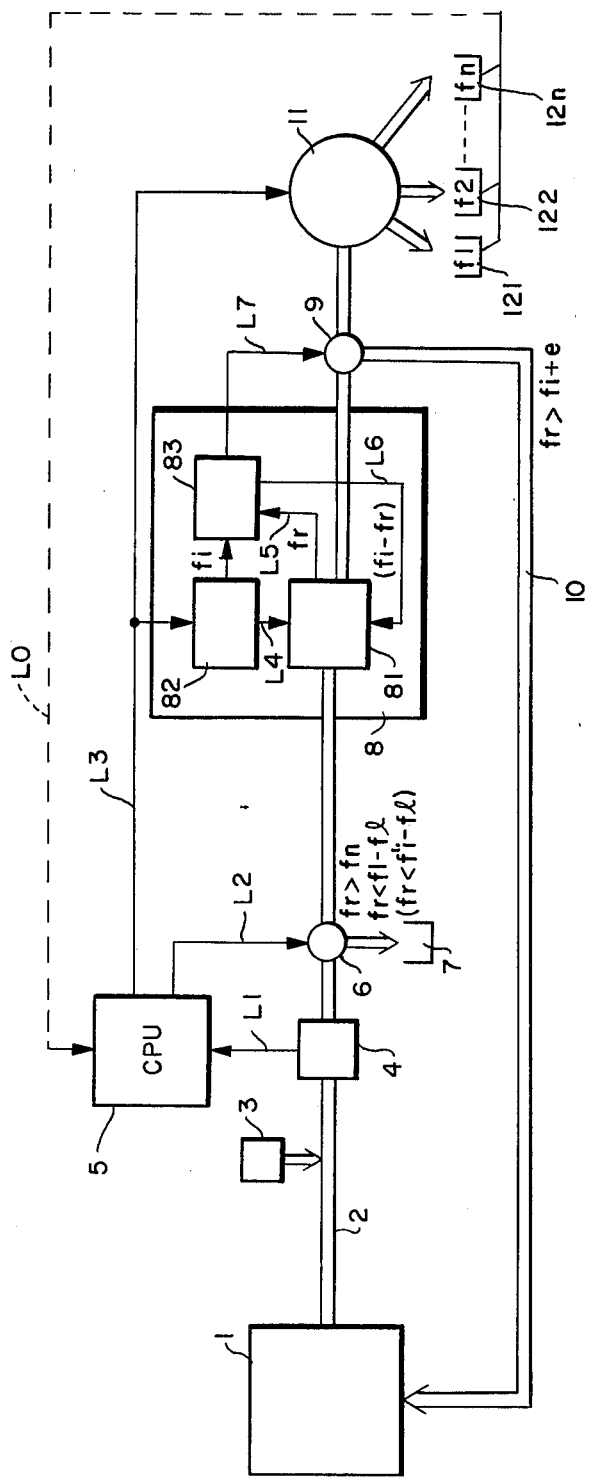
FIG. 5 is a block diagram of the embodiment of FIG. 4.

In FIG. 5, an embodiment having the purpose mentioned above can be obtained by the bus line L0 indicated by the broken line, added to the embodiment of FIG. 2. The added flow indicated by the thick line in the operation flow chart in FIG. 4 also corresponds to this embodiment, shown as a modification to the flow chart of FIG. 3.

It is easy to provide a mechanism which generates a pulse signal from each of the catchers 121, 122, ... or 12n (corresponding to the frequencies $f_i, f_2, \ldots f_n$) each time an adjusted good resonator of the corresponding frequency is caught, and the controller 5 may be expanded to count the pulse signals sent via the bus line L0 from each catcher. Therefore, the controller always keeps a count of how many trimmed good resonators $n_1, n_2, \ldots n_n$ have been obtained for each frequency.

Moreover, the number of resonators $N_1, N_2, \ldots N_n$ required for each adjusting target frequency has been set.

In FIG. 4, when the resonance frequency of a resonator to be adjusted is measured and the adjusting target frequency $f_i$ is set (flow (5-1), (5-2)), the controller 5 compares the number of resonators $n_i$ already obtained for the present adjusting target frequency $f_i$ with the present required number of resonators $N_i$ (flow (5-3)). When $N_i>n_i$ the resonator is adjusted to the adjusting target frequency $f_i$ by the trimming machine 8 as explained previously. On the other hand, when it is found that $N_i=n_i$, it is no longer necessary to obtain a resonator having the adjusting target frequency $f_i$. In such a case, therefore, the adjusting target frequency is changed to $f_{i+1}$ in accordance with the flow (5-4), and, in the flow (5-3), the required number of resonators $N_{i+1}$ corresponding to the changed value $f_{i+1}$ is compared with the number of resonators $n_{i+1}$ already obtained. Thus, comparisons are sequentially carried out, so that an adjusting target frequency $f_i$ is found for which the existing resonators are less than the required number. In this case, the difference between the actual resonance frequency $f_r$ and the finally obtained adjusting target frequency $f_i'$ may become large, and in some cases this difference exceeds the aforementioned adjusting limit $f_l$. This case is detected by the flow (5-5), and the relevant resonator is sent to the catcher 7 by means of the gate 6 when $f_r<f_i'-f_l$, since fine adjustment is no longer appropriate.

When the condition $f_r<f_i'-f_l$ does not occur, the resonators being sent to the trimming machine 8 are adjusted to the finally obtained adjusting target frequency $f_i'$. Thus, the embodiment of this invention conforming to the flow chart of FIG. 4 assures a system which regulates the quantity control of the adjusted good resonators.

As explained above, this invention assures high precision and highly efficient rapid frequency adjustment of mechanical resonators using laser or sand blast, and moreover is capable of automatically providing a required number of resonators at each desired frequency. Therefore, this invention contributes to the requirement of adjusting a large number of resonators for mechanical filters with excellent accuracy.

What is claimed is:

1. A method for automatic frequency adjustment of mechanical resonators in accordance with plural predetermined adjusting target frequencies, said method comprising the steps of:
   providing a trimming machine having a selectable adjusting frequency;
   providing a plurality of mechanical resonators;
   providing a plurality of adjusting target frequencies;
   specifying a maximum permissible range of frequency adjustment;
   predetermining a number of finished resonators to be provided at each target frequency;
   withdrawing a particular mechanical resonator to be adjusted from said plurality of resonators;
   measuring the resonance frequency of said particular resonator;
   comparing said measured resonance frequency with said target frequencies;
   selecting the one of said target frequencies which is higher than said measured resonance frequency and is closer to said measured resonance frequency than any other one of said target frequencies;

setting said adjusting frequency of said trimming machine to said selected one of said target frequencies;

ejecting said particular resonator, if said measured resonance frequency of said particular resonator is greater than any of said target frequencies;

ejecting said particular resonator, if said measured resonance frequency of said particular resonator is less than the lowest of said target frequencies by more than said maximum permissible range of adjustment;

trimming said particular resonator to adjust its's resonance frequency to that of said selected one of said target frequencies;

counting the total number of mechanical resonators adjusted by said trimming machine to each target frequency; and whenever said number of resonators produced at a particular target frequency coincides with said predetermined number corresponding to said particular target frequency, reassigning all further resonators which would have been adjusted to said particular target frequency to a different and higher target frequency for adjustment.

2. The method of claim 1, wherein, if said predetermined number of resonators has already been produced at each of said target frequencies within said permissible range of frequency adjustment above the resonance frequency of a particular mechanical resonator, said particular mechanical resonator is ejected for coarse adjustment.

* * * * *

UNITED STATES PATENT AND TRADEMARK OFFICE
CERTIFICATE OF CORRECTION

PATENT NO. : 4,395,849

DATED : Aug. 2, 1983

INVENTOR(S) : Kasai et al.

It is certified that error appears in the above-identified patent and that said Letters Patent is hereby corrected as shown below:

Front page, [56] FOREIGN PATENT DOCUMENTS, line 1, "2/1972" should be --2/1971--.

Column 3, line 55, "$f_1$" should be --$f_\ell$--;

Column 3, line 57, "$f_1$" (second occurrence) should be --$f_\ell$--.

Column 4, line 5, "$f_1$" (second occurrence) should be --$f_\ell$--;

Column 4, line 7, "$f_1$" (first and third occurrences) should be --$f_\ell$--;

Column 4, line 66, "+" should be --$\pm$--.

Column 6, line 27, "$f_1$" should be --$f_\ell$--;

Column 6, line 29, "$f_1$" should be --$f_\ell$--;

Column 6, line 31, "$f_1$" should be --$f_\ell$--.

Signed and Sealed this

Fifth Day of June 1984

[SEAL]

Attest:

GERALD J. MOSSINGHOFF

Attesting Officer

Commissioner of Patents and Trademarks